(12) United States Patent
Lacap et al.

(10) Patent No.: US 8,942,009 B2
(45) Date of Patent: *Jan. 27, 2015

(54) LEAD ASSEMBLY FOR A FLIP-CHIP POWER SWITCH

(75) Inventors: Efren M. Lacap, Union City, CA (US); Ilija Jergovic, Palo Alto, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 429 days.

This patent is subject to a terminal disclaimer.

(21) Appl. No.: 13/336,821

(22) Filed: Dec. 23, 2011

(65) Prior Publication Data

US 2013/0037926 A1 Feb. 14, 2013

Related U.S. Application Data

(63) Continuation of application No. 12/344,134, filed on Dec. 24, 2008, now Pat. No. 8,085,553.

(60) Provisional application No. 61/017,119, filed on Dec. 27, 2007.

(51) Int. Cl.
| | |
|---|---|
| *H05K 5/02* | (2006.01) |
| *H05K 7/18* | (2006.01) |
| *H01L 23/50* | (2006.01) |
| *H01L 23/498* | (2006.01) |
| *H02M 3/158* | (2006.01) |

(52) U.S. Cl.
CPC .......... *H01L 23/50* (2013.01); *H01L 23/49811* (2013.01); *H02M 3/1588* (2013.01); *H01L 2224/13111* (2013.01); *H01L 2224/13116* (2013.01); *H01L 2224/13124* (2013.01); *H01L 2224/13139* (2013.01); *H01L 2224/13147* (2013.01); *H01L 2224/16245* (2013.01); *H01L 2924/00013* (2013.01); *Y02B 70/1466* (2013.01); *H01L 2924/10253* (2013.01)

USPC ............ 361/813; 361/775; 361/790; 361/784

(58) Field of Classification Search
USPC .................. 361/772–775, 782–784, 790, 813; 257/666–670, 690–692, 685–686
See application file for complete search history.

(56) References Cited

U.S. PATENT DOCUMENTS

| | | | |
|---|---|---|---|
| 5,038,197 A | 8/1991 | Satriano | |
| 5,945,730 A | 8/1999 | Sicard et al. | |
| 6,713,823 B1 | 3/2004 | Nickel | |
| 8,400,784 B2 * | 3/2013 | You ............................... | 361/813 |
| 2007/0001278 A1* | 1/2007 | Jeon et al. ..................... | 257/676 |
| 2007/0057350 A1* | 3/2007 | Otremba ....................... | 257/666 |

(Continued)

*Primary Examiner* — Tuan T Dinh
(74) *Attorney, Agent, or Firm* — Lathrop & Gage LLP

(57) ABSTRACT

A power switch assembly includes a flip-chip type integrated circuit chip and a lead-frame with a plurality of spaced apart parallel lead sections. The flip-chip type integrated circuit chip includes a distributed transistor, and first and second pluralities of flip-chip interconnects connected to source and drain regions, respectively. The first and second lead sections at least partially overlap along the first axis. Each of the plurality of lead sections includes a contact portion and an extended portion extending laterally from the contact portion. The extended portions of the first and second lead section extend from the contact portion in opposite directions. The first side of the first and second lead section contacts at least two of the first and plurality of flip-chip interconnects, respectively. The second side of the first and second lead are configured to contact a first and second contact area on a printed circuit board, respectively.

27 Claims, 11 Drawing Sheets

(56) References Cited

U.S. PATENT DOCUMENTS

| | | |
|---|---|---|
| 2008/0035959 A1 | 2/2008 | Jiang |
| 2008/0048218 A1* | 2/2008 | Jiang .............................. 257/288 |
| 2008/0299705 A1* | 12/2008 | Lee ................................ 438/108 |
| 2011/0188218 A1* | 8/2011 | Hsing et al. .................... 361/772 |

\* cited by examiner

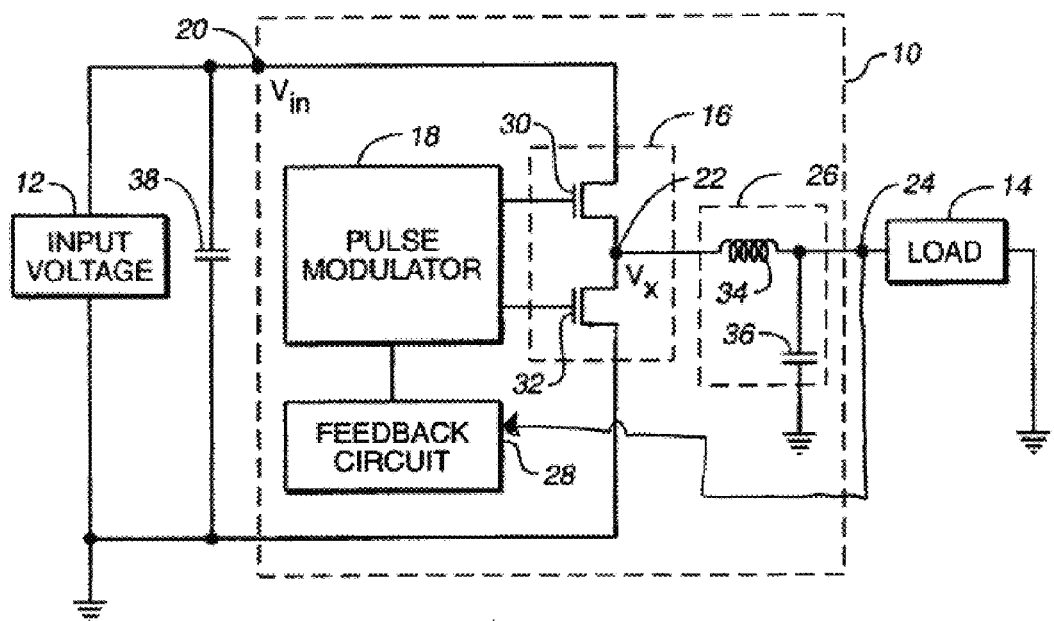
FIG._1

LEAD ASSEMBLY FOR A FLIP-CHIP POWER SWITCH

CROSS-REFERENCE TO RELATED APPLICATIONS

This application is a continuation of U.S. patent application Ser. No. 12/344,134, filed on Dec. 24, 2008, which will issue as U.S. Pat. No. 8,085,553, which claims priority to U.S. Provisional Application Ser. No. 61/017,119, filed on Dec. 27, 2007.

TECHNICAL FIELD

This disclosure relates to a lead assembly for a flip-chip power switch, and in one aspect, a voltage regulator that uses the flip-chip power switch and lead assembly.

BACKGROUND

Switching regulators can be fabricated at least partially with integrated circuit techniques. Specifically, for some switching regulators, the power switch portion has been fabricated in an integrated circuit chip with wire bond packaging (in which wires extend from the sides of the chip to the package, and the package has leads that are configured to be soldered to a printed circuit board). Unfortunately, one problem with wire bonds is that they have large parasitic inductance and resistance. More recently, for some switching regulators, the power switch portion has been fabricated in an integrated circuit chip with flip chip packaging (in which solder bumps are placed on the top surface of the chip, and the chip is mounted upside down with the solder bumps connected directly to a printed circuit board or to a package).

SUMMARY

In one aspect, a power switch assembly includes a flip-chip type integrated circuit chip and a lead-frame with a plurality of lead sections. The flip-chip type integrated circuit chip includes a distributed transistor fabricated therein having a plurality of source regions and a plurality of drain regions. The flip-chip type integrated circuit chip has a surface with a first plurality of flip-chip interconnects and a second plurality of flip-chip interconnects, the first plurality of flip-chip interconnects connected to the source regions, and the second plurality of flip-chip interconnects connected to the drain regions. The plurality of lead sections include a first lead section and a second lead section. Each of the plurality of lead sections extends in parallel with a first axis. The second lead section is spaced apart from the first lead section in a second direction orthogonal to the first axis, and the first lead section and the second lead section at least partially overlap along the first axis. Each of the plurality of lead sections includes a contact portion and an extended portion extending laterally from the contact portion. The extended portion of the first lead section extends from the contact portion of the first lead section in a first direction parallel to the first axis, and the extended portion of the second lead section extends from the contact portion of the second lead section in a direction opposite to the first direction. The contact portion of the first lead section and the contact portion of the second lead section do not fully overlap along the first axis. Each of the plurality of lead sections includes a first side and an opposite second side. The first side of the first lead section contacts at least two of the first plurality of flip-chip interconnects, and the first side of the second lead section contacts at least two of the second plurality of flip-chip interconnects. The second side of the first lead section in the contact portion of the first lead section is configured to contact a first contact area on a printed circuit board, and the second side of the second lead section in the contact portion of the second lead section is configured to contact a second contact area on the printed circuit board.

Implementations can include one or more of the following features. The plurality of lead sections may be located substantially entirely below the integrated circuit chip. The contact portion of the first lead section and the contact portion of the second lead need not overlap along the first axis. The extended portion of the first lead section or the second lead section may contact at least one of the first plurality of flip-chip interconnects or the second plurality of flip-chip interconnects, respectively. The extended portion of the first lead section may contact at least one of the first plurality of flip-chip interconnects and the extended portion of the second lead section may contact at least one of the second plurality of flip-chip interconnects. The contact portion of the first lead section or the second lead section may contacts at least one of the first plurality of flip-chip interconnects or the second plurality of flip-chip interconnects, respectively. The contact portion of the first lead section may contact at least one of the first plurality of flip-chip interconnects, and the contact portion of the second lead section may contact at least one of the second plurality of flip-chip interconnects. The flip chip interconnects may be solder bumps, solder balls, copper pillars or stud bumps. The first lead section and the second lead section may extend parallel to the first axis across substantially all of the integrated circuit chip. The first lead section and the second lead section may extend parallel to the first axis across about half of the integrated circuit chip. In each of the plurality of lead sections, the contact portion may be thicker than the extended portion.

The plurality of lead sections may include a third lead section spaced apart in the second direction from the second lead section, the first side of the third lead section may contact at least two of the first plurality of flip chip interconnects, and the third lead section may substantially overlap the first lead section along the first axis. The second side of the third lead section in the contact portion of the third lead section may be configured to contact the first contact area on the printed circuit board. The extended portion of the third lead section may extend from the contact portion of the third lead section in the first direction. The contact portion of the third lead section may substantially overlap the contact portion of the first lead section along the first axis. The plurality of lead sections may include a fourth lead section spaced apart in the second direction from the third lead section. The first side of the fourth lead section may contact at least two of the second plurality of flip chip interconnects, and the fourth lead section may substantially overlap the second lead section along the first axis. The second side of the fourth lead section in the contact portion of the fourth lead section may be configured to contact the second contact area on the printed circuit board. The extended portion of the fourth lead section may extend from the contact portion of the third lead section in the direction opposite to the first direction. The contact portion of the fourth lead section may substantially overlap the contact portion of the second lead section along the first axis.

The plurality of lead sections may includes a third lead section that is collinear with one of the first lead section or the second lead section. The first side of the third lead section may contact at least two of a third plurality of flip chip interconnects on the surface of the integrated circuit chip, and the second side of the third lead section in the contact portion of the third lead section may be configured to contact a third contact area on the printed circuit board. The third lead section may be collinear with the first lead section. The extended portion of the third lead section may extend from the contact portion of the third lead section along the first axis in the direction opposite to the first direction. The third lead section may be collinear with the second lead section. The extended portion of the third lead section may extend from the contact portion of the third lead section along the first axis in the first direction.

The plurality of lead sections may include a fourth lead section collinear with a different one of the first lead section or the second lead section than the third lead section, the first side of the fourth lead section may contact at least two of a fourth plurality of flip chip interconnects on the surface of the integrated circuit chip, and the third lead section and fourth lead section may substantially overlap along the first axis. The first plurality of flip chip interconnects and the second plurality of flip chip interconnects may be arranged in alternating rows, and the third plurality of flip chip interconnects and the fourth plurality of flip chip interconnects may be arranged in alternating rows. The third lead section may be collinear with the first lead section, the fourth lead section may be collinear with the second lead section, and the second side of the fourth lead section in the contact portion of the fourth lead section may be configured to contact the second contact area on the printed circuit board. The extended portion of the fourth lead section may extend from the contact portion of the fourth lead section in the first direction. The second lead section and the fourth lead section may be joined. The third lead section may be collinear with the second lead section, the fourth lead section may be collinear with the first lead section, and the second side of the fourth lead section in the contact portion of the fourth lead section may be configured to contact the first contact area on the printed circuit board. The extended portion of the fourth lead section may extend from the contact portion of the fourth lead section along the first axis in the direction opposite to the first direction. The first lead section and the fourth lead section may be joined. The second side of the fourth lead section in the contact portion of the fourth lead section may be configured to contact the same contact area on the printed circuit board as the contact portion of whichever of the first lead section or the second lead section is collinear with the fourth lead section. The integrated circuit chip may include a second distributed transistor fabricated therein having a second plurality of source regions and a second plurality of drain regions. The third plurality of flip chip interconnects may be connected to the second plurality of source regions, and the fourth plurality of flip chip interconnects may be connected to the second plurality of drain regions. The third plurality of flip chip interconnects may be connected to the second plurality of drain regions, and the fourth plurality of flip chip interconnects may be connected to the second plurality of source regions.

The first plurality of flip chip interconnects and the second plurality of flip chip interconnects may be arranged in alternating rows. The plurality of lead frame sections may include a plurality of first lead sections and a plurality of second lead sections. The plurality of first lead sections and the plurality of second lead sections may be disposed in alternating rows along the second direction. Contact portions of the plurality of first lead sections and plurality of second lead sections need not overlap along the first axis. Contact portions of the plurality of first lead sections may substantially overlap along the first axis, and contact portions of the plurality of second lead sections may substantially overlap along the first axis. Two or more of the second plurality of lead sections may be connected by another lead section extending in the second direction.

The plurality of lead sections may include a third and fourth plurality of lead sections, each of the third lead sections collinear with a first lead section, each of the fourth lead sections collinear with second lead section. The second surface of extended portion of the third plurality of lead sections may be connected to at least two of a third plurality of flip chip interconnects on the integrated circuit chip, and the second surface of extended portion of the fourth plurality of lead sections may be connected to at least two of the fourth plurality of flip chip interconnects on the integrated circuit chip. The first and third pluralities of lead section and the second and fourth pluralities of lead sections may be disposed in alternating rows. The another lead section may extend between the first plurality of lead sections and the third plurality of lead sections in the second direction and may connect the second plurality of lead sections with the fourth plurality of lead sections.

Each lead section may be a whole lead. The first side of each of the plurality of leads sections may be is approximately planar. The extended regions of the plurality of leads may have a substantially uniform first thickness, and the contact region of the plurality of leads may have a substantially uniform second thickness greater than the first thickness. The second side of each of the plurality of leads may be approximately planar over the extended portion and may be approximately planar over the contact portion. The lead-frame may include a plurality of leads, and one or more leads of the plurality of leads may include a plurality of lead sections.

In another aspect, a mounted power switch assembly includes a printed circuit board, a flip-chip type integrated circuit chip and a lead-frame with a plurality of lead sections. The printed circuit board has an electrically interconnected first contact area and an electrically interconnected second contact area. The flip-chip type integrated circuit chip includes a distributed transistor fabricated therein having a plurality of source regions and a plurality of drain regions, the flip-chip type integrated circuit chip having a surface with a first plurality of flip-chip interconnects and a second plurality of flip-chip interconnects, the first plurality of flip-chip interconnects connected to the source regions, the second plurality of flip-chip interconnects connected to the drain regions. The plurality of lead sections include a first lead section and a second lead section. Each of the plurality of lead sections extend in parallel with a first axis. The second lead section is spaced apart from the first lead section in a second direction orthogonal to the first axis, and the first lead section and the second lead section at least partially overlap along the first axis. Each of the plurality of lead sections includes a contact portion and an extended portion extending laterally from the contact portion. The extended portion of the first lead section extends from the contact portion of the first lead section in a first direction parallel to the first axis over the second contact area, and the extended portion of the second lead section extends from the contact portion of the second lead section in a direction opposite to the first direction over the first contact area. The contact portion of the first lead section and the contact portion of the second lead do not fully overlap along the first axis. Each of the plurality of lead sections includes a first side and an opposite second side. The first side of the first lead section contacts at least two of the first plurality of flip-chip interconnects, and the first side of the second lead section contacts at least two of the second plurality of flip-chip interconnects. The second side of the first lead section in the contact portion of the first lead section contacts the first contact area on the printed circuit board, and the second side of the second lead section in the contact portion of the second lead section contacts the second contact area on the printed circuit board.

Implementations can include one or more of the following features. Electrically conductive via may be formed through the printed circuit board in at least one of the first contact area under the second extended portion or the second contact area under the first extended portion.

Implementations may include one or more of the following advantages. The printed circuit board can use a trace configuration with large adjacent source and drain electrodes that can provide low resistance on the PCB. The conductive leads can be thickest in the regions that carry the largest current, thereby improving current capacity and reducing the risk of failure. The lead assembly can be compatible with a flip-chip structure with alternating rows of source and drain contacts. The assembly can be easy to construct.

The details of one or more embodiments are set forth in the accompanying drawings and the description below. Other features, objects, and advantages will be apparent from the description and drawings, and from the claims.

DESCRIPTION OF DRAWINGS

FIG. 1 is a block diagram of a switching regulator.

Like reference symbols in the various drawings indicate like elements.

DETAILED DESCRIPTION

Figure 2A:
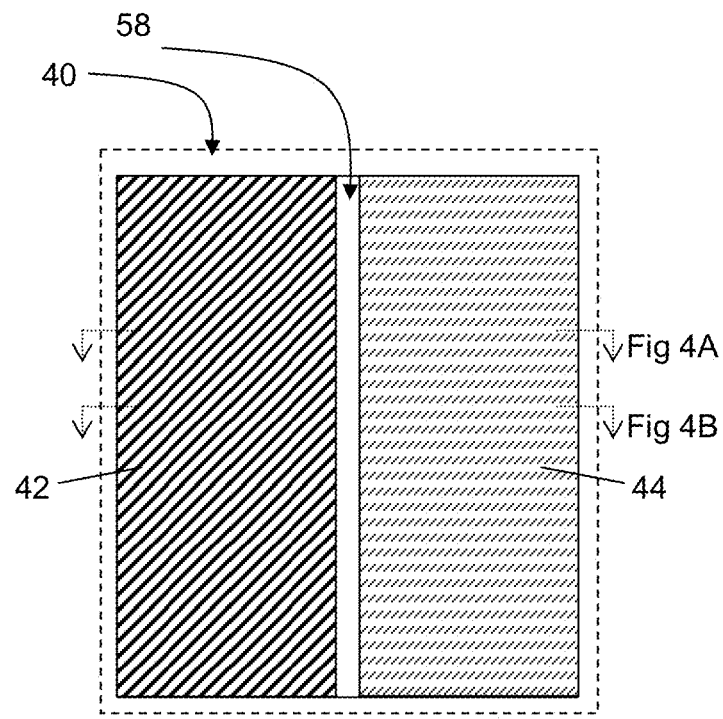
FIG. 2A is a top-down view of an implementation of a printed circuit board with electrodes.

Referring to FIG. 1, an implementation of a switching regulator 10 is coupled to a DC input voltage source 12, such as a battery, by an input terminal 20. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 and the output filter 26 may be configured in a buck converter topology, as shown in FIG. 1, with a first power switch 30 connected between the input terminal 20 and the intermediate terminal 22 and a second power switch 32 between the intermediate terminal 22 and ground. Both the first power switch 30 and the second power switch 32 can include multiple transistors, e.g., each can be a distributed transistor, in order to increase the current that can flow through the switch. The switching regulator 10 may also include an input capacitor 38 connected between the input terminal 22 and ground.

The switching regulator also includes a controller assembly with a pulse modulator 18 for controlling the operation of the switching circuit 16. The pulse modulator 18 causes the switching circuit 16 to generate an intermediate voltage having a rectangular waveform at the intermediate terminal 22. Although the pulse modulator 18 and the switching circuit 16 are illustrated and described below as a pulse width modulator, the invention is also applicable to various pulse frequency modulation schemes.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 34 connected between the intermediate terminal 22 and the output terminal 24 and a capacitor 36 connected in parallel with the load 14. During a first conduction interval, the voltage source 12 supplies energy to the load 14 and the inductor 34 via the first power switch 30. During a second conduction interval, the second power switch 32 is closed, and the energy is supplied by the inductor 34. The resulting output voltage $V_{out}$ is a substantially DC voltage. Although the switching circuit 16 and the output filter 26 are illustrated in a buck topology, the invention is also applicable to other switching voltage regulator topologies, such as a boost topology, a buck-boost topology, or various transformer-coupled topologies.

The output voltage is regulated, or maintained at a substantially constant level, by a feedback loop in the controller assembly that includes a feedback circuit 28. The feedback circuit 28 includes circuitry which measures the output voltage and/or the current passing through the intermediate terminal 22. The measured voltage and current are used to control the pulse modulator 18 so that the output voltage at the output terminal 24 remains substantially constant.

In general, various components can be placed on a printed circuit board to fabricate the switching regulator. For example, the feedback circuit 28 and pulse modulator 18 can be one IC chip mounted on the board, and the power switches 30 and 32 can be another one or two IC chips mounted on the board. The inductor 34 and capacitor 36 can be discrete components mounted on the board. Traces on the printed circuit board can provide the electrical connection between the components.

Figure 2B:
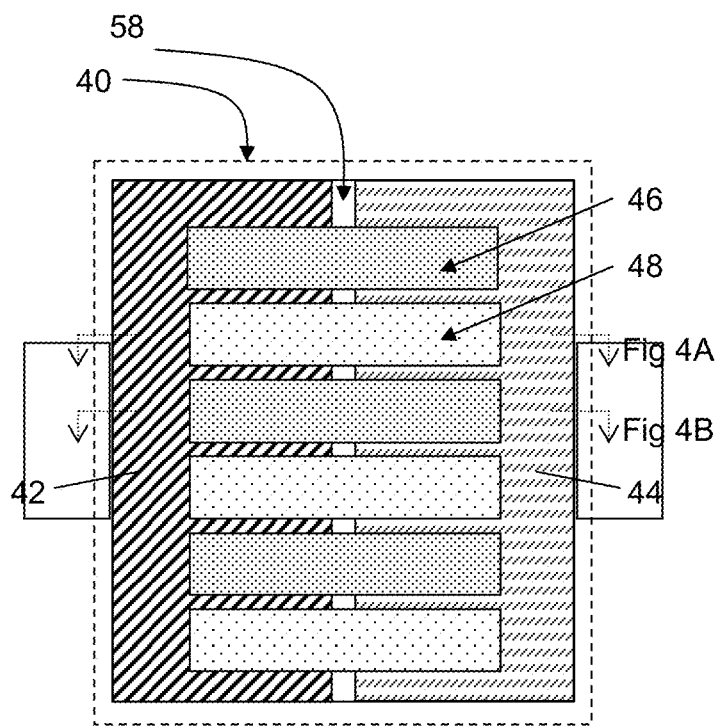
FIG. 2B is a top-down view of the printed circuit board of FIG. 2A on which leads of a power switch package are mounted.

Referring to FIGS. 2A-B, certain connections to power switch 30 and/or 32 are shown in a top-down view. As shown in FIG. 2A, a source electrode 42 and a drain electrode 44, which provide conductive contact areas for leads, are printed on the printed circuit board 40. The source electrode 42 and drain electrode 44 extend adjacently along a common border but are separated by a gap 58 to prevent shorting.

As shown in FIG. 2B, source leads 46 and drain leads 48 are arranged as a series of parallel strips that each extend over the source electrode 42 and the drain electrode 44. As illustrated in FIG. 2B, the leads at least partially overlap, e.g., entirely overlap, along an axis with which they extend in parallel ("overlap along an axis" means an overlap of the scalar projections of the leads onto a line parallel with the axis), and are the spaced apart in a second direction orthogonal to that first axis.

Note that only a portion of the source and drain electrodes to which leads are attached are shown. Also, as noted above, other components of switching regulator 10, including the pulse modulator, inductors and capacitors, can be mounted on the printed circuit board 40.

Figure 3:
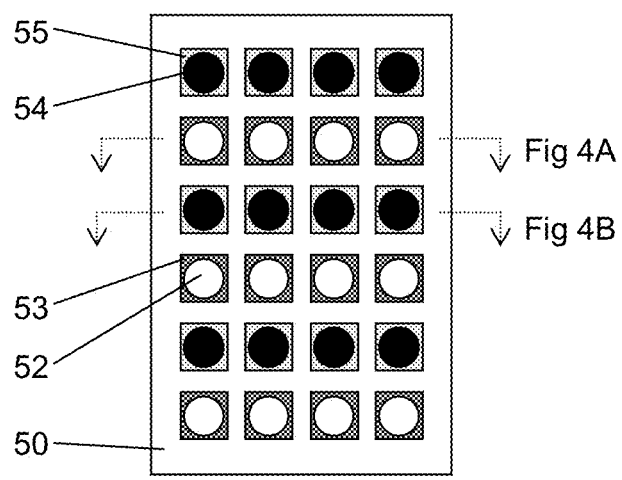
FIG. 3 is a bottom-up view of an implementation of a chip of a power switch package with source and drain pads and solder balls.

Referring to FIG. 3, a chip 50 that includes power switch 30 and/or 32 is shown in a bottom-up view. The chip 50, which will provide the switchable distributed transistors of the one or both power switches 30 and/or 32, has flip chip packaging with contact pads on a bottom surface. In some implementations, the chip 50 has alternating rows of source pads 53 and drain pads 55. Source solder balls 52 are disposed on the source pads 53, and drain solder balls 54 are disposed on the drain pads 55. Source and drain solder balls 52 and 54 may be formed from silver, aluminum, copper, brass, an alloy of lead or tin, or another metal or metal alloy. Source pads 53 and drain pads 55 are connected to the sources and drains, respectively, of the distributed transistors formed in chip 50. Although solder balls are one example of flip-chip interconnects that can be disposed on the contact pads, the flip chip interconnects could also be copper pillars, solder bars or bumps, stud bums, or other flip chip interconnects commonly used in the field.

Figure 4A:
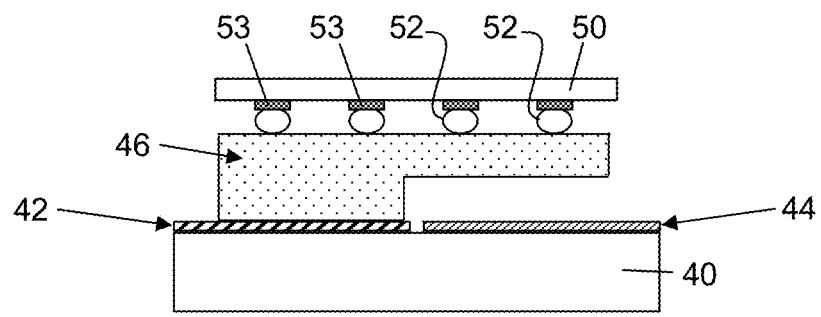
FIGS. 4A-4B are cross-sectional views of an implementation of a power switch assembly, including the power switch package mounted on a printed circuit board.
Figure 4B:
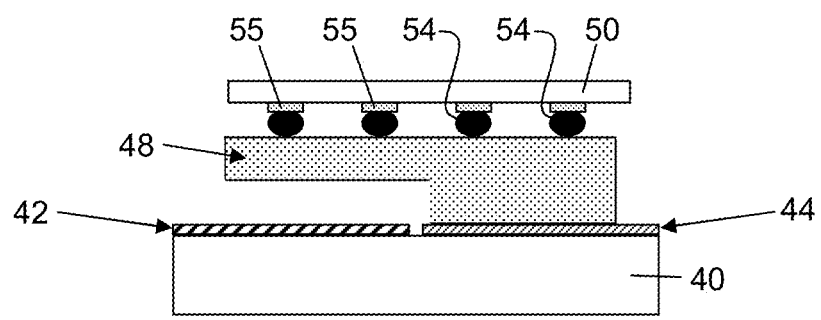

Referring to FIGS. 4A-4B, a power switch package, with the implementation of power switch 30 and/or 32 in a chip 50 as shown in FIG. 3, is shown mounted on the PCB in cross-sectional views. The power switch package can be considered to include the chip 50 as well as the lead assembly with source leads 46 and drain leads 48. As illustrated, the leads 46, 48 are located substantially entirely below the integrated circuit chip 50, and extend across substantially all of the integrated circuit chip 50.

Both FIGS. 4A and 4B show source electrode 42 and drain electrode 44 on the printed circuit board 40. FIG. 4A shows a cross-section of a source lead 46, which is mounted on and electrically connected to source electrode 42 and extends over but does not contact drain electrode 44. Each source pad 53 of integrated circuit chip 50 is connected to the top of the source lead 46 by a source solder ball 52. Thus, the source lead 46 and source solder balls 52 are configured to connect source pads 53 to source electrode 42 on the printed circuit board 40.

The components shown in FIG. 4A can be part of the power switch 30 and/or 32. For example, where the components form the first power switch 30, and the first power switch 30 is a p-channel device, source electrode 42 would be connected to input terminal 20 (see FIG. 1). As another example, where the components form the second power switch 32, source electrode 42 would be connected to ground.

FIG. 4B shows an arrangement similar to that shown in FIG. 4A, but of a drain lead 48, which is mounted on and electrically connected to drain electrode 44 and extends over but does not contact source electrode 42. Each drain pad 55 of integrated circuit chip 50 is connected to the top of drain lead 48 by a drain solder ball 54. Thus, the drain lead 48 and drain solder balls 54 are configured to connect drain pads 55 to drain electrode 44 on the printed circuit board 40. In relation to both power switches 30 and 32, drain electrode 44 would be connected to intermediate terminal 22 (see FIG. 1).

Referring again to FIGS. 4A-4B, leads 46 and 48 each have a thick end and a thin end, the thick end being the end connected to the electrode. For example, referring to FIG. 4A, the thick end of source lead 46 is connected to source electrode 42 whereas the thin end is disposed above, but not connected to, drain electrode 44. Likewise, as shown in FIG. 4B, drain lead 48 has a thick end and a thin end, the thick end connected to drain electrode 44. For example, the thick end can be about twice as thick as the thin end.

Source and drain leads 46 and 48 can have planar top surfaces and/or planar bottom surfaces. The top and bottom surfaces can be generally rectangular in shape. The top and bottom surfaces of the leads can have the same width, or can have different widths. For example, the bottom surface of the thick end (i.e. the surface that contacts the electrode) can be wider than the top surface of the lead (i.e. the surface that contacts the solder balls). Other geometries of the leads can be easily envisaged.

Figure 5:
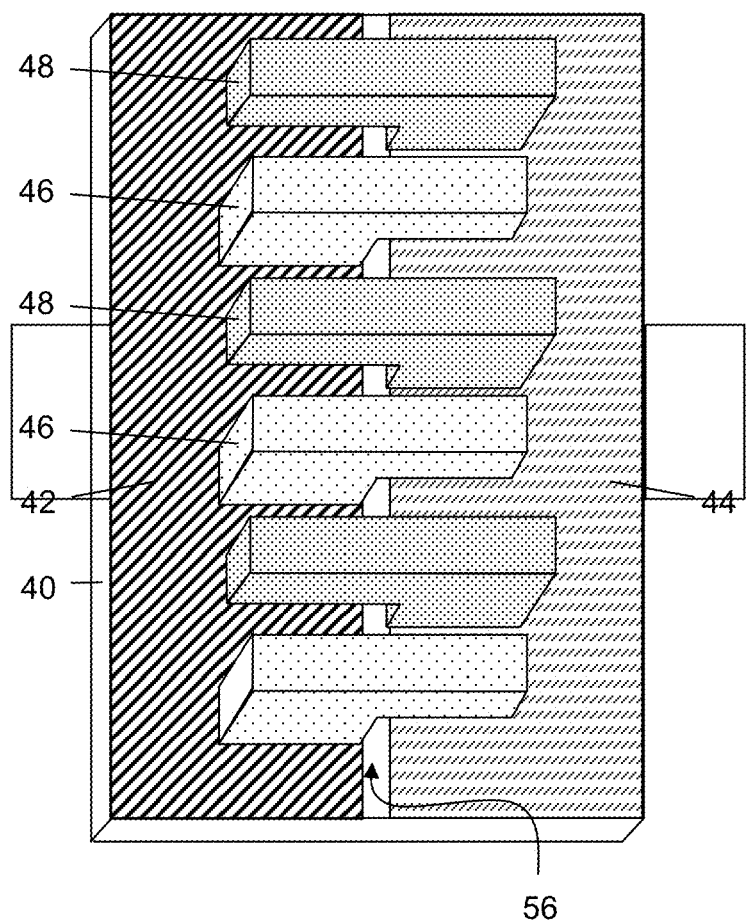
FIG. 5 is a perspective view of a printed circuit board on which an array of leads of a power switch package is mounted.

FIG. 5 shows, in perspective view, certain connections to power switch 30 and/or 32 shown in FIGS. 2-4. Source electrode 42 and drain electrode 44 are traces formed on printed circuit board 40. Source leads 46 and drain leads 48 are connected to source electrode 42 and drain electrode 44 respectively. As shown in FIG. 5, source leads 46 and drain leads 48 can be arrayed in an alternating fashion, e.g., source-drain-source-drain, along the common border 56 of the source and drain electrodes on the printed circuit board. Also as shown in FIG. 5, the leads can be arrayed in an anti-parallel fashion, i.e., with generally parallel primary axes but thin ends on opposite sides. Thus, the thin ends of source leads 46 can lead away from their thick ends in one direction, and the thin ends of drain leads 48 can lead away from their thick ends in a roughly opposite, or anti-parallel, direction. In this arrangement, source and drain leads 46 and 48 can also be considered to be arranged in an alternating array with the thin ends of source leads 46 pointing in one direction, and the thin ends of drain leads 48 pointing in a roughly opposite direction.

As illustrated in FIG. 5, the thick portions of the source leads 46 that contact the PCB substantially overlap each other along the axis with which they extend in parallel, but do not overlap the thick portions of the drain leads 48 along that axis. Similarly, the thick portions of the drain leads 48 that contact the PCB substantially overlap each other along the axis with which they extend in parallel, but do not overlap the thick portions of the source leads 48 along that axis.

Alternatively, the source and drain pads 53 and 55 can be arranged in other regular patterns, with a corresponding matching pattern in the source and drain leads 46 and 48. Other arrangements can be envisaged.

As discussed above, source leads 46 are connected to the sources of the distributed transistors formed in chip 50. Correspondingly, drain leads 48 are connected to the drains of the distributed transistors. In addition, other electrical connections can be made, e.g., gate leads can be connected gates of the distributed transistors, in another area of the chip.

Source leads 46 and drain leads 48 can be held in place by packaging material, such as mold compound, not shown. For example, the packaging material, typically formed from a suitable non-conductive material, can be disposed to encapsulate the lead section and only leave the portions configured to contact the contact area exposed after the integrated circuit chip has been mounted on the leads by means of flip chip connection. This can provide support and/or to orient or align the leads. Optionally, the packaging can be part of the packaging surrounding the silicon chip. While not wanting to be bound to any particular theory, since each pad 53 or 55 contributes to the total current, by having the thick end of each lead 46 or 48 contact the electrode on the printed circuit board, the portion of the lead with the lowest resistance carries the largest current load, thus potentially reducing power dissipation. Furthermore the leads serve to take an alternating pattern of solder ball connections on one pitch and have twice the pitch of the thick portions of lead sections.

FIGS. 6-9 show another implementation of power switches 30 and 32 fabricated on a single chip. In one implementation, power switch 30 is made of p-channel devices, e.g., PMOS transistors, and power switch 32 is made of n-channel devices, e.g., NMOS transistors. Referring to FIG. 6A, a PMOS source electrode 62, an NMOS source electrode 64, and a drain electrode 66 are printed on a printed circuit board 60. (Note that printed circuit board 60 may contain other components of switching regulator 10, including the feedback circuit, pulse modulator, inductors and capacitors.) In this implementation, the drain electrode 66 is positioned between the PMOS source electrode 62 and NMOS source electrode 64, with each source electrode extending along and separate by a gap from an opposite side of the drain electrode 66.

Figure 6A:
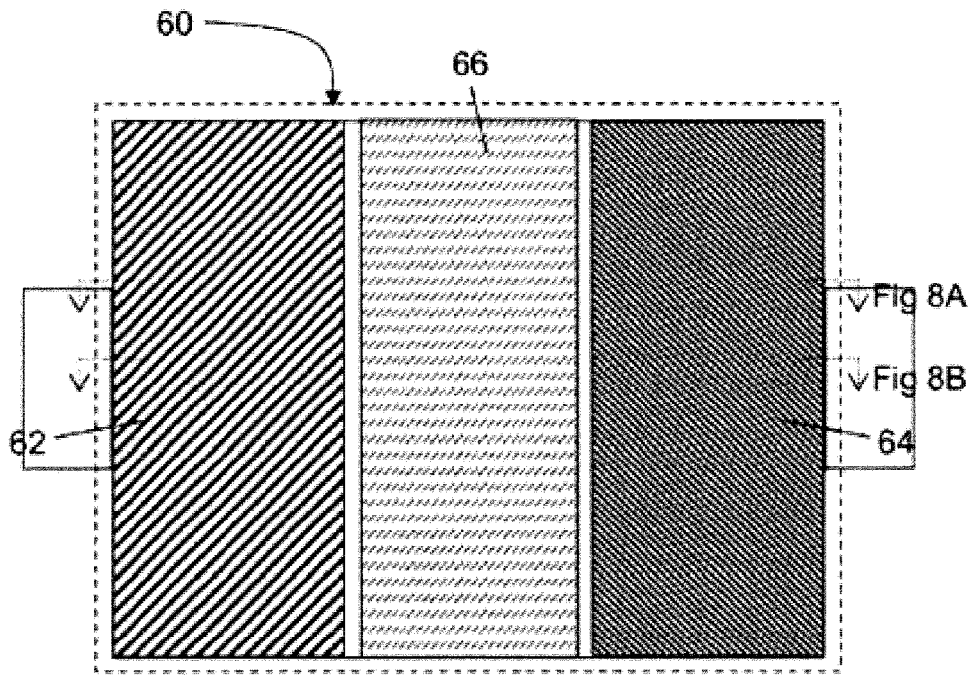
FIG. 6A is a top-down view of an implementation of a printed circuit board with electrodes.
Figure 6B:
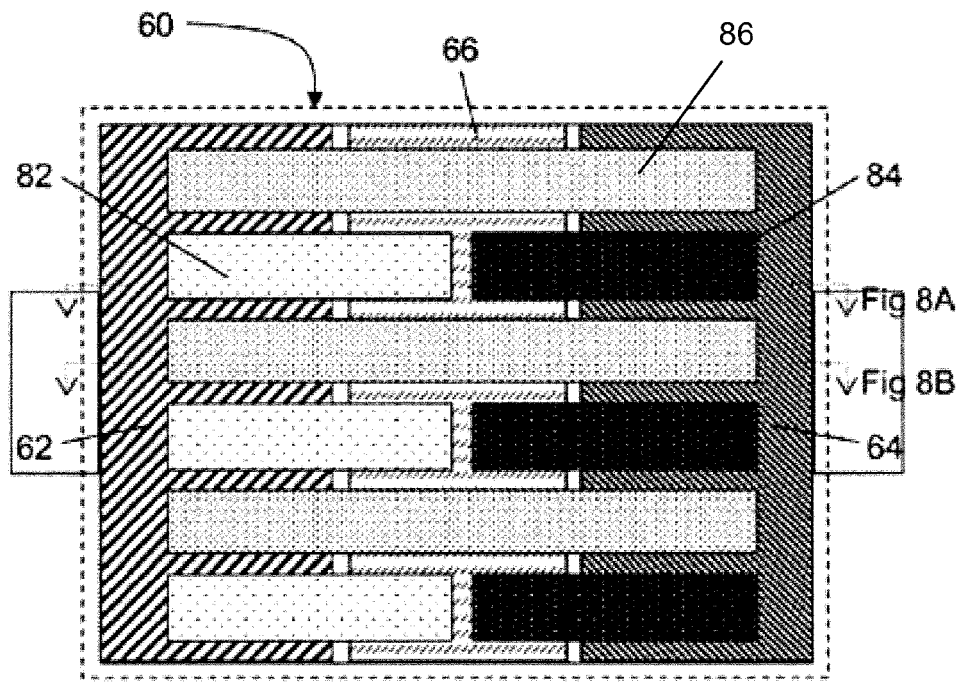
FIG. 6B is a top-down view of the printed circuit board of FIG. 6A with an implementation of leads of a power switch package.

As shown in FIG. 6B, PMOS source leads 82, NMOS source leads 84, and drain leads 86 are arranged in a series of parallel strips, with the source leads and drain leads in alternating rows and with each lead extending over electrodes 62, 64, and 66.

Figure 7:
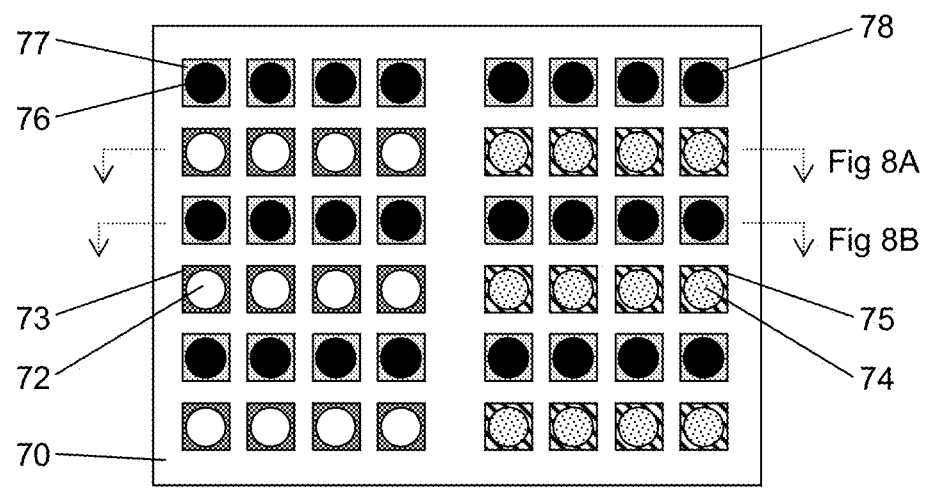
FIG. 7 is a view of an implementation of a chip of a power switch package with multiple source pads and drain pads, and solder balls.

Referring to FIG. 7, other components of an implementation of power switches 30 and 32 are shown in a bottom-up view. A chip 70 which will provide the switchable integrated circuits of both power switches 30 and 32 contains alternating rows of source pads, e.g., PMOS source pads 73 and NMOS source pads 75, and drain pads, e.g., PMOS drain pads 77 and NMOS drain pads 78. Solder balls are disposed over the pads; PMOS source solder balls 72 are disposed over PMOS source pads 73, NMOS source solder balls 74 are disposed over NMOS source pads 75, and drain solder balls 76 are disposed over drain pads 77 and 78. As in the previously described implementation, solder balls 72, 74, and 76 may be formed from silver, aluminum, copper, brass, an alloy of lead or tin, or another metal or metal alloy. PMOS source pads 73, NMOS source pads 75, PMOS drain pads 77 and NMOS drain pads 78 are connected to the PMOS sources and NMOS sources, PMOS drains and NMOS drains, respectively, of the transistors formed on chip 70.

Figure 8A:
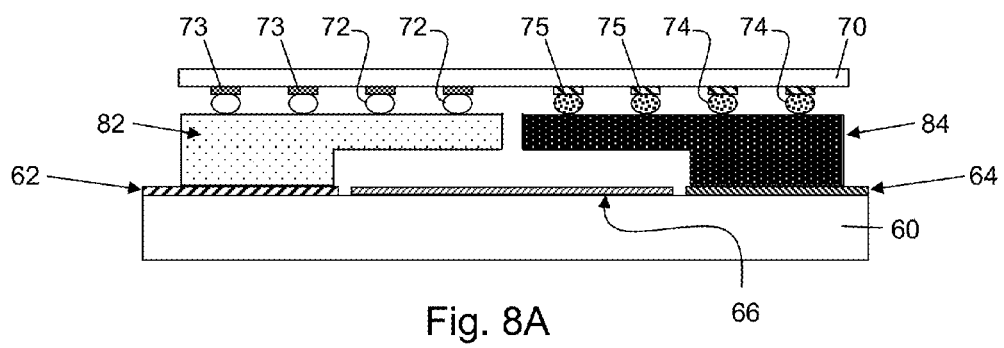
FIGS. 8A-8B are cross-sectional views of an implementation of a power switch assembly, including the power switch package mounted on a printed circuit board.
Figure 8B:
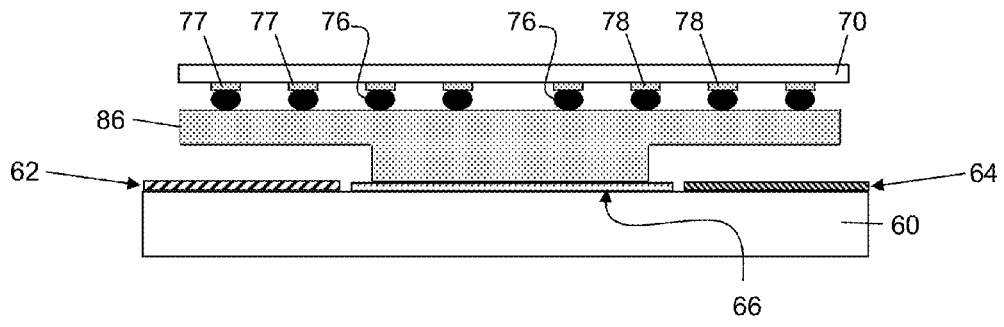

Referring to FIGS. 8A-8B, the implementation of power switches 30 and 32 shown in FIGS. 6-7 is shown mounted on a PCB in cross-sectional views. Both figures show PMOS source electrode 62, NMOS source electrode 64, and drain electrode 66 on printed circuit board 60. FIG. 8A shows a cross-section of a PMOS source lead 82 and an NMOS source lead 84. As illustrated, the PMOS source lead 81 and the NMOS source lead 84 extend across about half of the integrated circuit chip. The PMOS source lead 82 is mounted on and electrically connected to PMOS source electrode 62 and extends over but does not contact drain electrode 66. The NMOS source lead 84 is mounted on and electrically connected to NMOS source electrode 64 and extends over but does not contact drain electrode 66. As illustrated, the source leads 82, 84 are collinear but extend in opposite directions. FIG. 8A also shows the PMOS source pads 73 and NMOS source pads 75 of chip 70, on each of which is disposed a PMOS source solder ball 72 and an NMOS source solder ball 74, respectively, which contact the top surfaces of the PMOS source lead 82 and NMOS source lead 84, respectively. Thus, the PMOS source leads 82 and PMOS source solder balls 72 are configured to connect source pads 73 to PMOS source electrode 62, and the NMOS source leads 84 and NMOS source solder balls 74 are configured to connect NMOS source pads 75 to NMOS source electrode 64. In relation to power switches 30 and 32, PMOS source electrode 62 can be connected to input terminal 20, and NMOS source electrode 64 can be connected to ground (see FIG. 1).

FIG. 8B shows an arrangement similar to that shown in FIG. 8A, but of a drain lead 86. The drain lead 86 is mounted on and electrically connected to drain electrode 66 and extends over but does not contact PMOS source electrode 62 and NMOS source electrode 64. Integrated circuit chip 70 has PMOS and NMOS drain pads 77 and 78, on each of which is disposed a drain solder ball 76 which contacts the top surface of the drain lead 86. Thus, the drain lead 86 and drain solder balls 76 are configured to connect drain pads 77 and 78 to drain electrode 66 on printed circuit board 60. In relation to power switches 30 and 32, drain electrode 66 would be connected to intermediate terminal 22 (see FIG. 1). As a result of this connection, in this implementation, the PMOS and NMOS transistors share a common drain.

As illustrated in FIG. 8B, some of the leads can include multiple lead sections, e.g., lead 86 can include two joined lead sections extending in opposite directions. However, as illustrated in FIG. 5, in some implementations a single lead section provides the whole lead.

Referring again to FIG. 8A, PMOS source leads 82 and NMOS source leads 84 each have a thick end and a thin end, the thick end being the end connected to the corresponding PMOS or NMOS electrode. For example, the thick end of PMOS source lead 82 is connected to PMOS source electrode 62 whereas the thin end is disposed above, but not connected to, drain electrode 66. Similarly, the thick end of NMOS source lead 84 is connected to NMOS source electrode 64 whereas the thin end is disposed above, but not connected to, drain electrode 66. As shown in FIG. 8B, drain lead 86 has a first and a second thin end, and a thick middle region. The thick middle region is connected to drain electrode 66 whereas each first and second thin end is disposed above, but not connected to, a source electrode 62 or 64. For example, the thick end can be about twice as thick as the thin end.

As in the previously described implementation, source leads 82 and 84, and drain leads 86, can have planar top surfaces and/or planar bottom surfaces. The top and bottom surfaces can be generally rectangular in shape. The top and bottom surfaces of the leads can have the same width, or can have different widths. For example, the bottom surface of the thick end (i.e. the surface that contacts the electrode) can be wider than the top surface of the lead (i.e. the surface that contacts the solder balls). Other geometries of the leads can be envisaged.

Figure 9:
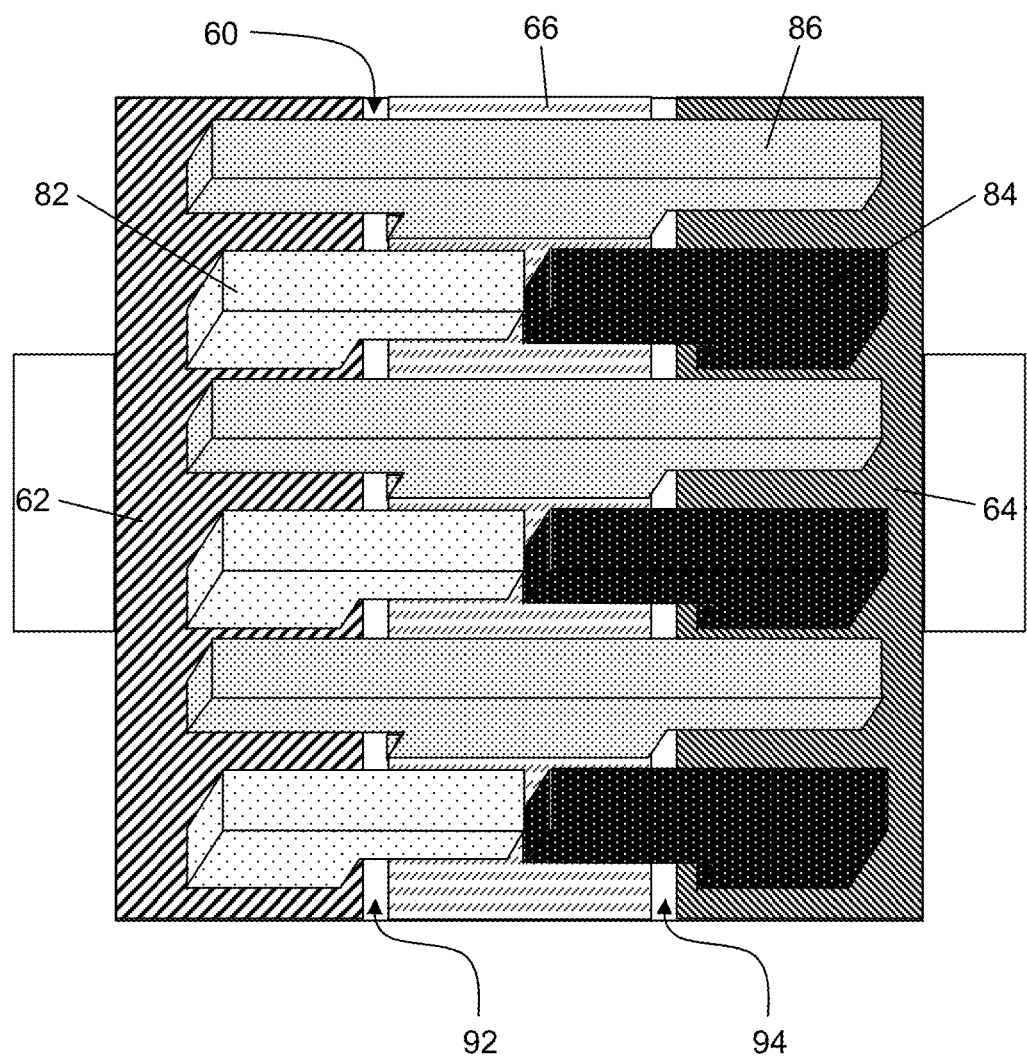
FIG. 9 is a perspective view of a printed circuit board on which an implementation of an array of source leads and drain leads of a power switch package is mounted.

FIG. 9 shows, in perspective view, connections to power switches 30 and 32 shown in FIGS. 6-8. PMOS source electrode 62, NMOS source electrode 64 and drain electrode 66 are traces formed on printed circuit board 60. PMOS source leads 82, NMOS source leads 84, and drain leads 86 are configured to be connected to PMOS source electrode 62, NMOS source electrode 64, and drain electrode 66, respectively. As shown in FIG. 9, source leads 82 and 84, and drain leads 86, can be arrayed in an alternating fashion, i.e. source-drain-source-drain, along the common borders 92 and 94 of the source and drain electrodes on the printed circuit board. Also as shown in FIG. 9, the leads can be arrayed with a generally parallel primary axis. The leads can also be arranged so that the thin ends of source leads 82 and 84 lead away from their respective thick ends toward each other, and the first and second thin ends of drain lead 86 lead away from the thick middle region in opposite directions. A multitude of other arrangements can be easily envisaged. As discussed above, source leads 82 and 84 are connected to the sources of the distributed transistors formed in chip 70. Correspondingly, drain leads 86 are connected to the drains of the distributed transistors.

Figure 10:
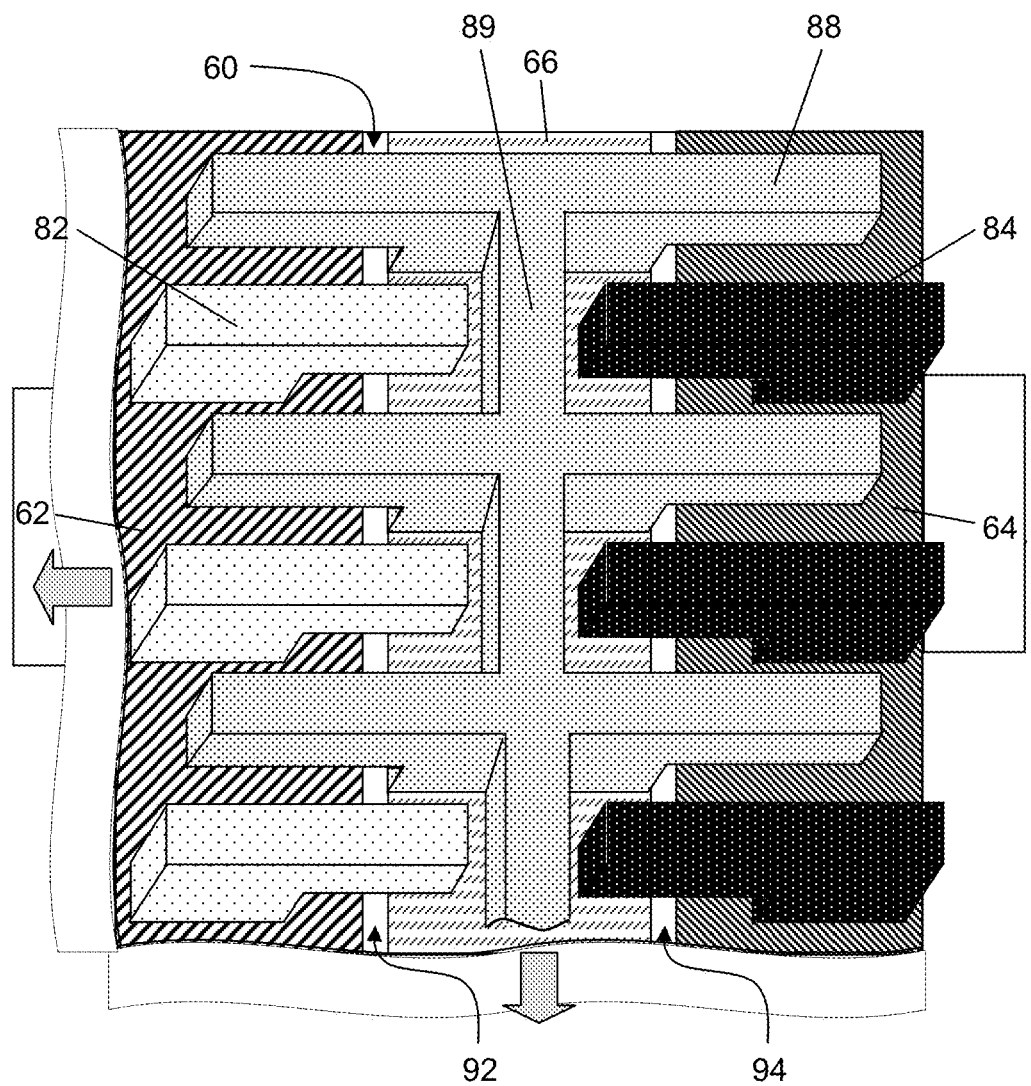
FIG. 10 is a perspective view of a printed circuit board on which another implementation of an array of leads of a power switch package is mounted.

FIG. 10 shows an alternative connection to power switches 30 and 32 shown in FIG. 9. In this implementation, drain lead 88 is formed from one piece and includes center channel 89. Center channel 89 may have the same thickness as the thick middle region of drain lead 88 (see FIG. 8B). The top surface of center channel 89 may be co-planar with the rest of the top surface of drain lead 88. Drain leads 88 and center channel 89 can extend along borders 92 and 94, e.g. to accommodate drain pads 78 (see FIG. 8B) and other elements of power switches 30 and 32. The width of center channel 89 can depend on the overall layout of rest of the device. PMOS source leads 82 and NMOS source leads 84 may be situated, e.g. laterally offset, to allow space for the center channel 89 of drain lead 88. Note that FIG. 10 is drawn to indicate that printed circuit board 60, and other components of power switches 30 and 32 thereon, may extend laterally beyond those regions illustrated, as determined by fabrication, design, and other considerations. Other implementations may extend laterally in similar fashion, even though not explicitly indicated in the other figures.

Figure 11:
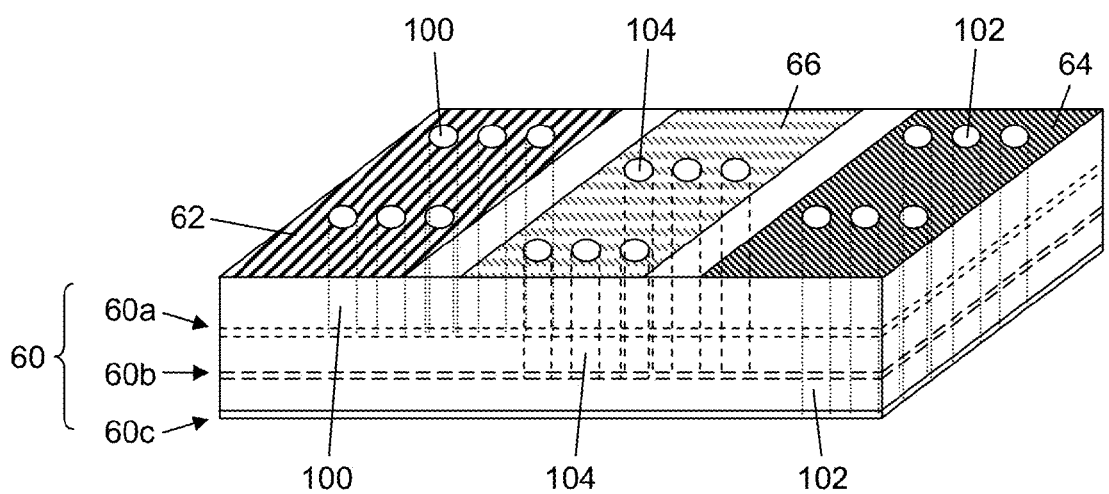
FIG. 11 is a perspective, partially cut-away view of vias connecting electrodes to conducting layers in or on the printed circuit board.

FIG. 11 illustrates an embodiment of power switches 30 and 32 with vias to carry current from the electrodes on one surface of printed circuit board 60 to a conductive layer 60a, 60b, or 60c. PMOS source vias 100, NMOS source vias 102, and drain vias 104 extend from PMOS source electrode 62, NMOS source electrode 64, and drain electrode 66, respectively, through printed circuit board 60 to conductive layer 60a, 60b, or 60c. Conductive layers 60a and 60b are located within printed circuit board 60, and conductive layer 60c is located at the opposite surface as the electrodes. Each conductive layer is separated by an insulating layer. Using conventional photolithography techniques, the vias can be constructed so they are electrically insulated from other features within the printed circuit board. For example, PMOS source via 100 can be connected to conductive layer 60a, and electrically insulated from conductive layers 60b and 60c. Similarly, drain vias 104 can be connected to conductive layer 60b, and electrically insulated from conductive layers 60a and 60c. Vias may be situated on regions of the corresponding electrode that are not in direct contact with the corresponding lead. In this way, contact between each lead and electrode will not be affected by the presence of the vias. The vias may lead to other components located at the respective conductive layers, e.g. a wire may be bonded to conductive layer 60a, 60b, or 60c to provide electrical connection to another component of the power switch.

A number of embodiments of the invention have been described. Nevertheless, it will be understood that various modifications may be made without departing from the spirit and scope of the invention. For example, although the illustrated implementations of the leads are constructed with exactly two regions of uniform thickness (one to contact the associated electrode and one to extend over the other electrode), the region extending over the other electrode could have a tapered bottom surface or include multiple regions with different thickness. Although the gap between the electrodes on the PCB is illustrated as linear and the thick portions are illustrated as adjacent the gap, the border between the electrodes need not be linear and the thick portions do not have to align against this border.

As another example, in the implementation discussed with respect to FIGS. 6A-9, the first transistor 30 is a PMOS device and the second transistor 32 is an NMOS device, so that the drain of the first transistor 30 are connected to the drain of the second transistor on the common electrode 66. However, both the first transistor 30 and the second transistor 32 could be n-channel devices, e.g., both could be n-channel LDMOS devices, in which case the source of the first transistor 30 can be connected to the drain of the second transistor 32 on the common electrode 66 (with electrode 62 being for the drain of the first transistor 30 and electrode 64 being for the source of the second transistor 32). In addition, the source of the first transistor 30 could be connected to the source of the second transistor 32 on the common electrode 66 (with electrode 62 being for the drain of the first transistor 30 and electrode 64 being for the drain of the second transistor 32). Also, other permutations of NMOS, PMOS and LDMOS devices are possible.

Accordingly, other embodiments are within the scope of the following claims.

What is claimed is:

1. A power switch assembly, comprising:
    a flip-chip type integrated circuit chip including at least one distributed transistor fabricated therein, the flip-chip type integrated circuit chip having a surface with a first plurality of flip-chip interconnects and a second plurality of flip-chip interconnects, the first plurality of flip-chip interconnects and the second plurality of flip-chip interconnects connected to different terminals of the at least one distributed transistor; and
    a lead-frame with a plurality of lead sections including a first lead section and a second lead section, each of the plurality of lead sections extending in parallel with a first axis, the second lead section spaced apart from the first lead section in a second direction orthogonal to the first axis, the first lead section and the second lead section at least partially overlapping along the first axis,
    wherein each of the plurality of lead sections includes a contact portion and an extended portion extending laterally from the contact portion, the extended portion of the first lead section extends from the contact portion of the first lead section in a first direction parallel to the first axis, the extended portion of the second lead section extends from the contact portion of the second lead section in a direction opposite to the first direction, and the contact portion of the first lead section and the contact portion of the second lead section do not fully overlap along the first axis, and wherein each of the plurality of lead sections includes a first side and an opposite second side, the first side of the first lead section contacting at least two of the first plurality of flip-chip interconnects, the first side of the second lead section contacting at least two of the second plurality of flip-chip interconnects, the second side of the first lead section in the contact portion of the first lead section configured to contact a first contact area on a printed circuit board, and the second side of the second lead section in the contact portion of the second lead section configured to contact a second contact area on the printed circuit board.

2. The power switch assembly of claim 1, wherein the first plurality of flip-chip interconnects are connected to a plurality of source regions of the at least one distributed transistor and the second plurality of flip-chip interconnects are connected to a plurality of drain regions of the at least one distributed transistor.

3. The power switch assembly of claim 1, wherein the plurality of lead sections are located substantially entirely below the integrated circuit chip.

4. The power switch assembly of claim 1, wherein the contact portion of the first lead section and the contact portion of the second lead do not overlap along the first axis.

5. The power switch assembly of claim 1, wherein in each of the plurality of lead sections the contact portion is thicker than the extended portion.

6. A power switch assembly, comprising:
a flip-chip type integrated circuit chip including at least one distributed transistor fabricated therein, the flip-chip type integrated circuit chip having a surface with at least one first flip-chip interconnect and at least one second flip-chip interconnect, the at least one first flip-chip interconnect and the at least one second flip-chip interconnect connected to different terminals of the at least one distributed transistor; and
a lead-frame with a plurality of lead sections including a first lead section and a second lead section, each of the plurality of lead sections extending in parallel with a first axis, the second lead section spaced apart from the first lead section in a second direction orthogonal to the first axis, the first lead section and the second lead section at least partially overlapping along the first axis,
wherein each of the plurality of lead sections includes a contact portion and an extended portion extending laterally from the contact portion, the extended portion of the first lead section extends from the contact portion of the first lead section in a first direction parallel to the first axis, the extended portion of the second lead section extends from the contact portion of the second lead section in a direction opposite to the first direction, and the contact portion of the first lead section and the contact portion of the second lead section do not fully overlap along the first axis, and wherein each of the plurality of lead sections includes a first side and an opposite second side, the first side of the first lead section contacting the at least one first flip-chip interconnect, the first side of the second lead section contacting the at least one second flip-chip interconnect, the second side of the first lead section in the contact portion of the first lead section configured to contact a first contact area on a printed circuit board, and the second side of the second lead section in the contact portion of the second lead section configured to contact a second contact area on the printed circuit board.

7. The power switch assembly of claim 6, wherein the at least one first flip-chip interconnect is connected to a source region of the at least one distributed transistor and the at least one second flip-chip interconnect is connected to a drain region of the at least one distributed transistor.

8. The power switch assembly of claim 6, wherein the at least one first flip-chip interconnect contacts both the extended portion and contact portion of the first lead section and the at least one second flip-chip interconnect contacts both the extended portion and contact portion of the second lead section.

9. The power switch assembly of claim 6, wherein the plurality of lead sections are located substantially entirely below the integrated circuit chip.

10. The power switch assembly of claim 6, wherein in each of the plurality of lead sections the contact portion is thicker than the extended portion.

11. A power switch assembly, comprising:
a flip-chip type integrated circuit chip including at least one distributed transistor fabricated therein, the flip-chip type integrated circuit chip having a surface with a first plurality of flip-chip interconnects and a second plurality of flip-chip interconnects, the first plurality of flip-chip interconnects and the second plurality of flip-chip interconnects connected to different terminals of the at least one distributed transistor; and
a lead-frame with a plurality of lead sections including a first lead section and a second lead section,
wherein each of the plurality of lead sections includes a contact portion and an extended portion extending laterally from the contact portion, and wherein each of the plurality of lead sections includes a first side and an opposite second side, the first side of the first lead section contacting at least two of the first plurality of flip-chip interconnects, the first side of the second lead section contacting at least two of the second plurality of flip-chip interconnects, the second side of the first lead section in the contact portion of the first lead section configured to contact a first contact area on a printed circuit board located laterally beneath the integrated circuit chip, and the second side of the second lead section in the contact portion of the second lead section configured to contact a second contact area on the printed circuit board located laterally beneath the integrated circuit chip,
wherein at least one contact portion is located at least partially laterally beneath at least one flip chip interconnect,
wherein each of the plurality of lead sections extends in parallel with a first axis, the second lead section spaced apart from the first lead section in a second direction orthogonal to the first axis, the first lead section and the second lead section at least partially overlapping along the first axis.

12. The power switch assembly of claim 11, wherein the plurality of lead sections are located substantially entirely below the integrated circuit chip.

13. The power switch assembly of claim 11, wherein the extended portion of the first lead section extends from the contact portion of the first lead section in a first direction parallel to the first axis, the extended portion of the second lead section extends from the contact portion of the second lead section in a direction opposite to the first direction, and the contact portion of the first lead section and the contact portion of the second lead section do not fully overlap along the first axis.

14. The power switch assembly of claim 11, wherein in each of the plurality of lead sections the contact portion is thicker than the extended portion.

15. The power switch assembly of claim 11, further comprising an additional lead section joined to the first lead section.

16. A power switch assembly, comprising:
a flip-chip type integrated circuit chip including at least one distributed transistor fabricated therein, the flip-chip type integrated circuit chip having a surface with a plurality of flip-chip interconnects connected to the at least one distributed transistor; and
a lead-frame with a plurality of lead sections including a first lead section and a second lead section, each of the plurality of lead sections extending in parallel with a first axis, the second lead section spaced apart from the first lead section in a second direction orthogonal to the first axis, the first lead section and the second lead section at least partially overlapping along the first axis,
wherein each of the plurality of lead sections includes a contact portion and an extended portion extending laterally from the contact portion, the extended portion of the first lead section extends from the contact portion of the first lead section in a first direction parallel to the first axis, the extended portion of the second lead section extends from the contact portion of the second lead section in a direction opposite to the first direction, and the contact portion of the first lead section and the contact portion of the second lead section do not fully overlap along the first axis, and wherein each of the plurality of lead sections includes a first side and an opposite second side, the first side of the first lead section contacting a first two of the plurality of flip-chip interconnects, the first side of the second lead section contacting at a second two of the second plurality of flip-chip interconnects, the second side of the first lead section in the contact portion of the first lead section configured to contact a first contact area on a printed circuit board located laterally beneath the integrated circuit chip, and the second side of the second lead section in the contact portion of the second lead section configured to contact a second contact area on the printed circuit board located laterally beneath the integrated circuit chip.

17. A power switch assembly, comprising:
a flip-chip type integrated circuit chip including a first distributed transistors and a second distributed transistor fabricated therein, the flip-chip type integrated circuit chip having a surface with a first plurality of flip-chip interconnects, a second plurality of flip-chip interconnects, and a third plurality of flip-chip interconnects and a fourth plurality of flip-chip interconnects, the first plurality of flip-chip interconnects connected to a first terminal of the first distributed transistor, the second plurality of flip-chip interconnects connected to a first terminal of the second distributed transistor; and
a lead-frame with a plurality of lead sections including a first lead section, a second lead section, and a third lead section
wherein each of the plurality of lead sections includes a contact portion and an extended portion extending laterally from the contact portion, and wherein each of the plurality of lead sections includes a first side and an opposite second side, the first side of the first lead section contacting at least one of the first plurality of flip-chip interconnects, the first side of the second lead section contacting at least one of the second plurality of flip-chip interconnects, the first side of the third lead section contacting at least one of the third plurality of flip-chip interconnects, the second side of the first lead section in the contact portion of the first lead section configured to contact a first contact area on a printed circuit board, the second side of the second lead section in the contact portion of the second lead section configured to contact a second contact area on the printed circuit board, and the second side of the third second lead section in the contact portion of the third lead section configured to contact a third contact area on the printed circuit board,
wherein the third lead section is connected through the third plurality of flip-chip interconnects to a second terminal of the first distributed transistor and to a second terminal of the second distributed transistor.

18. The power switch assembly of claim 17, wherein the second terminal of the first distributed transistor comprises the drain terminal of the first distributed transistor and the second terminal of the second distributed transistor comprises the drain terminal of the second distributed transistor.

19. The power switch assembly of claim 17, wherein the second terminal of the first distributed transistor comprises the drain terminal of the first distributed transistor and the second terminal of the second distributed transistor comprises the source terminal of the second distributed transistor.

20. The power switch assembly of claim 17, wherein the second terminal of the first distributed transistor comprises the source terminal of the first distributed transistor and the second terminal of the second distributed transistor comprises the source terminal of the second distributed transistor.

21. The power switch assembly of claim 17, wherein the plurality of lead sections are located substantially entirely below the integrated circuit chip.

22. The power switch assembly of claim 17, wherein in each of the plurality of lead sections the contact portion is thicker than the extended portion.

23. A power switch assembly, comprising:
a flip-chip type integrated circuit chip including at least one distributed transistor fabricated therein, the flip-chip type integrated circuit chip having a surface with a first plurality of flip-chip interconnects and a second plurality of flip-chip interconnects, the first plurality of flip-chip interconnects and the second plurality of flip-chip interconnects connected to different terminals of the at least one distributed transistor; and
a lead-frame with a plurality of lead sections including a first lead section, a second lead section and a third lead section, each of the plurality of lead sections extending in parallel with a first axis, the second lead section spaced apart from the first lead section in a second direction orthogonal to the first axis, the third lead section spaced apart in the second direction from the second lead section, the first lead section and the third lead section substantially overlapping the second lead section along the first axis;
wherein each of the plurality of lead sections includes a contact portion and an extended portion extending laterally from the contact portion, the extended portion of the first lead section extends from the contact portion of the first lead section in a first direction parallel to the first axis, the extended portion of the second lead section extends from the contact portion of the second lead section in a direction opposite to the first direction, and the contact portion of the first lead section and the contact portion of the second lead section do not fully overlap along the first axis, and wherein each of the plurality of lead sections includes a first side and an opposite second side, the first side of the first lead section contacting at least one of the first plurality of flip-chip interconnects, the first side of the second lead section contacting at least one of the second plurality of flip-chip interconnects, the first side of the third lead section contacting at least another one of the first plurality of flip-chip interconnects, the second side of the first lead section in the contact portion of the first lead section configured to contact a first contact area on a printed circuit board, the second side of the second lead section in the contact portion of the second lead section configured to contact a second contact area on the printed circuit board, and the second side of the third lead section in the contact portion of the third lead section configured to contact the first contact area on the printed circuit board, and wherein the first lead section and the third lead section are joined.

24. The power switch assembly of claim 23, wherein the first lead section and the third lead section are joined by another lead section extending in the second direction.

25. The power switch assembly of claim 23, wherein the another lead section is located laterally beneath the integrated circuit chip.

26. The power switch assembly of claim 23, wherein the plurality of lead sections are located substantially entirely below the integrated circuit chip.

27. The power switch assembly of claim 23, wherein in each of the plurality of lead sections the contact portion is thicker than the extended portion.

* * * * *

UNITED STATES PATENT AND TRADEMARK OFFICE
CERTIFICATE OF CORRECTION

PATENT NO. : 8,942,009 B2  
APPLICATION NO. : 13/336821  
DATED : January 27, 2015  
INVENTOR(S) : Lacap et al.

Page 1 of 1

It is certified that error appears in the above-identified patent and that said Letters Patent is hereby corrected as shown below:

In the Specification

Column 2, Line 20, "contacts" should read --contact--; Line 61, "includes" should read --include--;
Column 4, Line 16, "The another" should read --Another--; Line 22, "may be is" should read --may be--;
Column 5, Line 7, "area" should read --areas--;
Column 7, Line 12, "the spaced" should read --spaced--; Line 35, "bums" should read --bumps--;

In the Claims

Column 15, Line 26, Claim 17, "distributed transistors" should read --distributed transistor--.

Signed and Sealed this
Fourteenth Day of July, 2015

Michelle K. Lee
*Director of the United States Patent and Trademark Office*